(12) United States Patent
Mandel et al.

(10) Patent No.: US 7,416,011 B2
(45) Date of Patent: Aug. 26, 2008

(54) ELECTRONIC ASSEMBLY HAVING A SUBSTRATE LAMINATED WITHIN A BACKPLATE CAVITY

(75) Inventors: Larry M Mandel, Noblesville, IN (US); Timothy D. Garner, Kokomo, IN (US); Andrew R. Baker, Kokomo, IN (US)

(73) Assignee: Delphi Technologies, Inc., Troy, MI (US)

( * ) Notice: Subject to any disclaimer, the term of this patent is extended or adjusted under 35 U.S.C. 154(b) by 285 days.

(21) Appl. No.: 11/044,343

(22) Filed: Jan. 27, 2005

(65) Prior Publication Data

US 2006/0164818 A1    Jul. 27, 2006

(51) Int. Cl.
*B32B 37/00*    (2006.01)

(52) U.S. Cl. ..................................... 156/581; 156/580

(58) Field of Classification Search ................. 156/228, 156/580, 581, 583.1, 583.3; 100/315, 316, 100/214, 240, 269.02, 269.03
See application file for complete search history.

(56) References Cited

U.S. PATENT DOCUMENTS 5,494,546 A * 2/1996 Horvath ...................... 156/102

FOREIGN PATENT DOCUMENTS

| DE | 19625756 | 1/1998 |
|----|----------|--------|
| DE | 10102848 | 1/2002 |
| FR | 2659344  | 9/1991 |
| FR | 2733656  | 10/1996 |
| GB | 1561685  | 2/1980 |

OTHER PUBLICATIONS

EP Search Report dated Jan. 8, 2008.

* cited by examiner

*Primary Examiner*—James Sells
(74) *Attorney, Agent, or Firm*—Jimmy L. Funke

(57) ABSTRACT

An electronic assembly includes a backplate, a substrate and a pressure sensitive adhesive (PSA). The backplate includes a cavity and the substrate includes a plurality of interconnected electrical components. The substrate is positioned within the cavity and a wall height of the cavity is greater than a combined thickness of the substrate and the adhesive, which bonds the substrate to the backplate.

8 Claims, 2 Drawing Sheets

ELECTRONIC ASSEMBLY HAVING A SUBSTRATE LAMINATED WITHIN A BACKPLATE CAVITY

TECHNICAL FIELD

The present invention is generally directed to an electronic assembly and, more specifically, to an electronic assembly that includes a substrate laminated within a backplate cavity.

BACKGROUND OF THE INVENTION

Historically, various electronic assembly manufacturers have used a pressure sensitive adhesive (PSA) to bond an unpopulated substrate, e.g., printed circuit board (PCB), to a metal backplate. In general, the metal backplate has provided rigidity for the PCB and has protected the PCB from mechanically induced stresses. Usually, the PCB and backplate have been fed into a roller machine that includes one or more rollers that have applied pressure between the unpopulated PCB and backplate to activate a PSA (positioned between the PCB and backplate) and attach the PCB to the backplate. By applying pressure from one end of the assembly to the other end of the assembly, the roller machine has usually minimized air trapped between the PCB and the backplate. In such prior art assemblies, the backplate has been substantially flat such that no surface of the plate extended above a top surface of the PCB. This backplate surface limitation has been necessary due to the fact that the roller must contact the PCB to ensure activation of the PSA and, in turn, bonding of the PCB to the backplate. Unfortunately, the utilization of a flat backplate has generally negatively impacted the cost and design of the electronic assembly, as assemblies with flat backplates have required multiple additional mechanical panels to form a product enclosure.

Further, electronic assemblies that have first bonded an unpopulated PCB to a backplate have required that the PCB be populated after bonding of the PCB to the backplate. After population, the populated PCB and its associated backplate have both then been placed in a reflow oven, to initiate a solder reflow process at a desired temperature. Heating the mass of the backplate to the desired temperature has required additional energy which has increased the cost of the assembly. Further, the cooling time of the assembly has been increased as the backplate, due to its mass, cools more slowly than the PCB (and its associated electrical components) and, thus, has increased a processing time of the assembly. Additionally, when an electronic assembly manufactured in this manner fails an electrical test, the electrically defective assembly has generally been scrapped, as opposed to being reworked, due to the difficulty in reworking a populated PCB that is bonded to a backplate. Moreover, the reflow solder profile for such assemblies has been more complicated and, in turn, more expensive.

What is needed is a technique for bonding a populated (and electrically tested) substrate to a backplate. It would also be desirable if the technique allowed the backplate to be utilized as a more significant portion of a product enclosure.

SUMMARY OF THE INVENTION

One embodiment of the present invention is generally directed to an electronic assembly that includes a backplate, a substrate and a pressure sensitive adhesive (PSA). The backplate includes a cavity and the substrate includes a plurality of interconnected electrical components. The substrate is positioned within the cavity and a wall height of the cavity is greater than a combined thickness of the substrate and the adhesive, which bonds the substrate to the backplate.

According to another aspect of the present invention, the substrate is a printed circuit board (PCB). According to a different aspect, the backplate functions as a portion of a product enclosure. According to another embodiment of the present invention, a lamination apparatus includes a frame, a linear motion device, a ram, a first elastomer and a second elastomer. The frame includes a base for receiving a workpiece, e.g., an electronic assembly, and the linear motion device is attached to the frame opposite the base. The ram is coupled to an end of the linear motion device and includes at least one air passage that provides an air evacuation path, when the ram is working on a workpiece. The first elastomer is centrally positioned on and attached to the ram to function as a plunger. The second elastomer is attached to the ram around its edges and contacts and covers the first elastomer to form a convex outer surface.

These and other features, advantages and objects of the present invention will be further understood and appreciated by those skilled in the art by reference to the following specification, claims and appended drawings.

BRIEF DESCRIPTION OF THE DRAWINGS

The present invention will now be described, by way of example, with reference to the accompanying drawings, in which.

DESCRIPTION OF THE PREFERRED EMBODIMENTS

Figure 1:
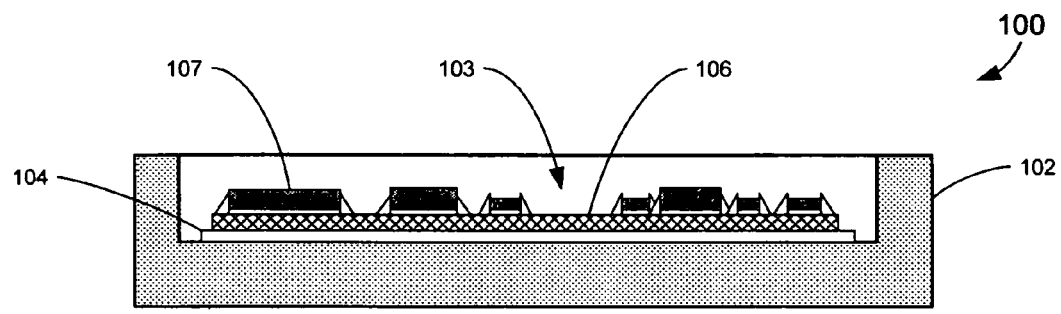
FIG. 1 is a cross-sectional view of a relevant portion of an electronic assembly, configured according to one embodiment of the present invention.

In a typical electronic assembly, a substrate, e.g., a printed circuit board (PCB), is populated with various electrical components to provide a desired functionality. As noted above, the substrate has been positioned on a flat plate that may be made of a metal, such as aluminum. In a typical assembly, the backplate may serve as a heat sink and/or a stiffener for the PCB and may be cast or machined. The substrate is typically laminated to the backplate using one of a variety of pressure sensitive adhesive (PSA) tapes, e.g., a Polymer Science 0275 PSA. In general, proper lamination is dependent upon pressure and time (and, in some cases, may require heat and vacuum). As is mentioned above, current techniques for laminating a PCB to a backplate have required that the backplate be flat or substantially flat, so as to not interfere with a roller that has been utilized to apply a pressure, between the substrate and backplate, to activate a PSA and bond the substrate to the backplate.

According to the present invention, an electronic assembly includes a backplate that has a cavity for receiving a populated substrate. In general, a wall height of the walls of the cavity is greater than a combined thickness of the adhesive and the substrate. This feature allows the backplate to also serve as a portion of a product enclosure, if desired. According to the present invention, a substrate may be populated with electrical components and tested, before lamination, into a cavity of a backplate. In general, this permits the manufacturing of a less expensive electronic assembly, as less expensive reflow solder profiles may be implemented, cool down periods may be shortened and the solder reflow process time may be shortened. It should be appreciated that the backplate may have a cavity of virtually any depth. As stated above, this permits integration of mechanical enclosure components and increases product design freedom. For example, as noted above, the backplate can readily become part of the product enclosure.

According to another embodiment of the present invention, a lamination apparatus is designed to apply pressure from the center of the substrate and outward toward the edges, which readily allows for the evacuation of air from between the substrate and the PCB (to achieve better thermal transfer from the PCB, through the PSA, to the backplate). For example, a non-complex lamination apparatus may be designed with an air cylinder, a ram, a first elastomer (e.g., a Poron® plunger) and a second elastomer (e.g., a Sorbothane® pad). According to this embodiment of the present invention, the air cylinder is attached to a frame, which provides a base for receiving a workpiece, i.e., an electronic assembly. The air cylinder is mounted opposite the base and includes a ram located at one end, which includes a Poron® plunger, e.g., 4701-40 Series, attached thereto and a Sorbothane® pad, e.g., 0212100, 30 duro Shore 00, covering the Poron® plunger. In general, the second elastomer forms a parabolic shape that conforms to the electrical components that are mounted on the substrate, without damaging the solder joints that attach the components to conductive traces of the substrate.

With reference to FIG. 1, a cross-sectional view of an exemplary electronic assembly 100 is depicted. As is shown in FIG. 1, the assembly 100 includes a backplate 102, including a cavity 103. A substrate 106, including a plurality of integrated electrical components 107, is positioned within the cavity 103. As is shown in FIG. 1, the height of the walls of the cavity extend beyond a top surface of the printed circuit board (PCB) 106. A pressure sensitive adhesive (PSA) 104 bonds the substrate 106 to the backplate 102, upon being activated by an appropriate pressure for an appropriate time. It should be appreciated that a wide variety of substrates may be utilized, e.g., a PCB or a ceramic substrate.

Figure 2:
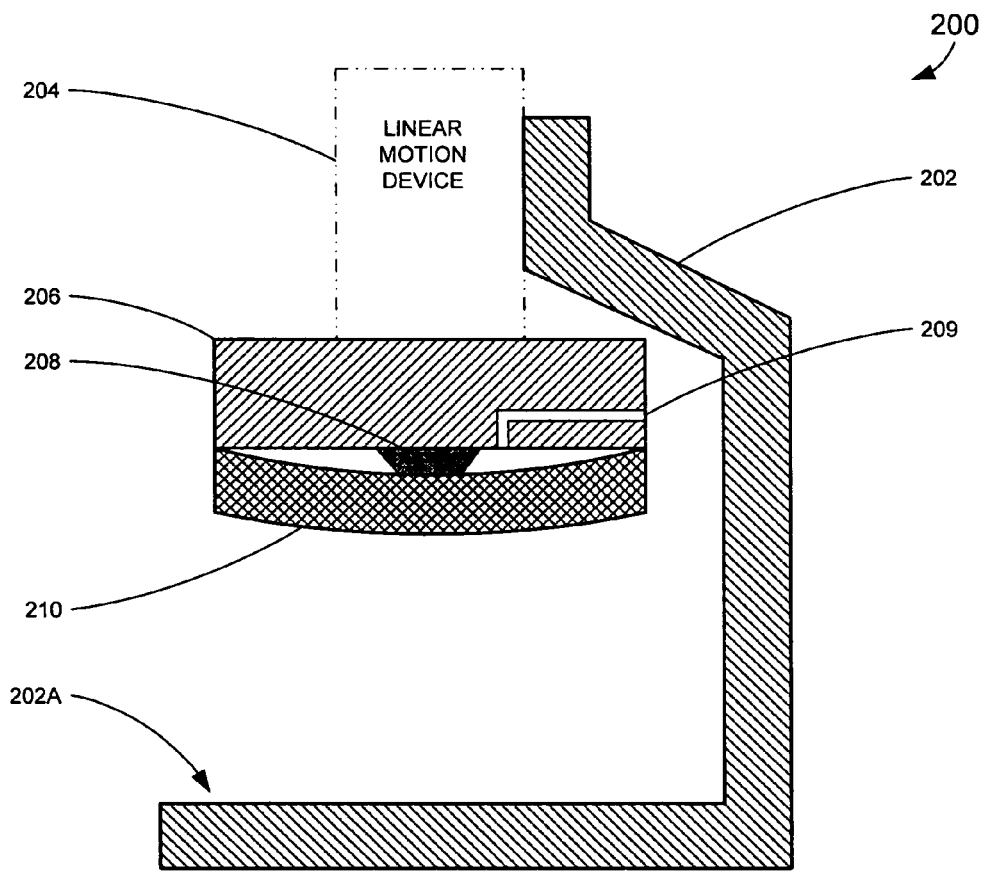
FIG. 2 is a perspective view of an exemplary lamination apparatus for bonding a substrate, e.g., a printed circuit board (PCB), in a cavity of a backplate.

With reference to FIG. 2, a lamination apparatus 200, constructed according to one embodiment of the present invention, is depicted. The apparatus 200 includes a frame 202 having a base 202A for receiving a workpiece, i.e., the electronic assembly 100. A linear motion device 204 is attached to the frame 202, opposite the base 202A. Positioned at one end of the linear motion device 204 is a ram 206 that includes an air passage 209 that allows air trapped between an elastomer 210 and the ram 206 to be removed. As is shown, an elastomer 208 is centrally positioned on the ram 206 to cause the elastomer 210 to have a convex outer surface.

Figure 3A:
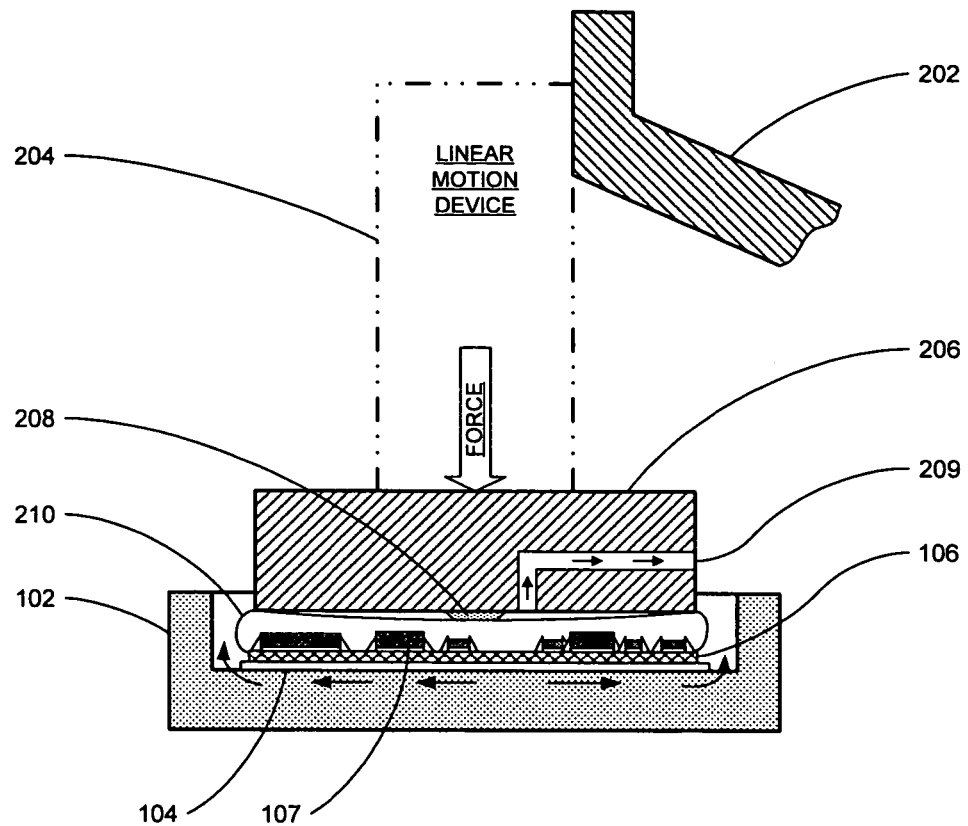
FIG. 3A is a partial cross-sectional view of the apparatus of FIG. 2, as it acts on the electronic assembly of FIG. 1.
Figure 3B:
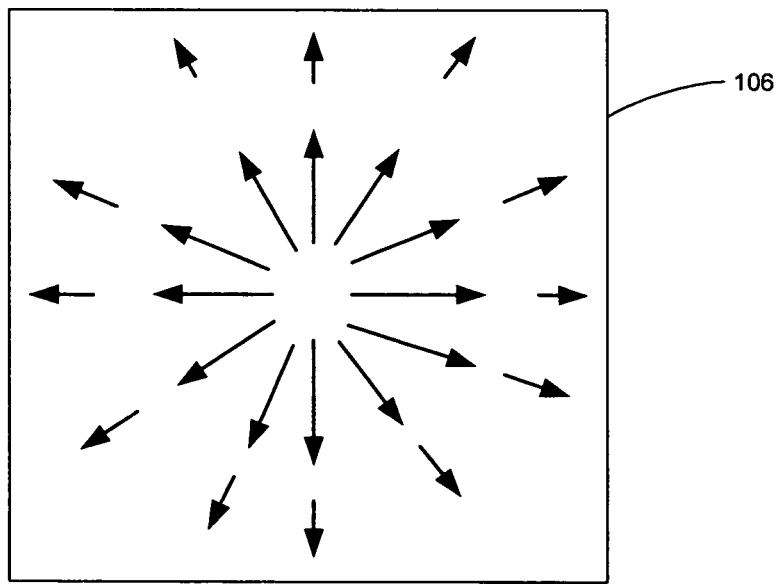
FIG. 3B is a diagram of an air evacuation path for air trapped between the PCB and backplate of the assembly of FIG. 1.

With reference to FIG. 3A, the ram 206, attached to the linear motion device 204, is shown acting on the assembly 100. As is depicted, air trapped between the elastomer 210 and the ram 206 follows the air evacuation path through a passage 209. Similarly, with reference to FIG. 3B, air trapped between the substrate 106 and the backplate 102 exits radially from the center of the substrate 106. This is due to the positioning and shape of the elastomer 208, which is centrally positioned on and attached to the ram 206 and which functions as a plunger.

Accordingly, an electronic assembly and a lamination apparatus for producing the electronic assembly have been disclosed herein. The lamination apparatus advantageously allows for the effective and efficient bonding of a populated substrate within a cavity of a backplate.

The above description is considered that of the preferred embodiments only. Modifications of the invention will occur to those skilled in the art and to those who make or use the invention. Therefore, it is understood that the embodiments shown in the drawings and described above are merely for illustrative purposes and not intended to limit the scope of the invention, which is defined by the following claims as interpreted according to the principles of patent law, including the doctrine of equivalents.

The invention claimed is:

1. A lamination apparatus, comprising:
   a frame including a base;
   a linear motion device attached to the frame opposite the base;
   a ram coupled to an end of the linear motion device, the ram including at least one air passage that provides an air evacuation path when the ram is working on a workpiece;
   a first elastomer attached to the ram attached only to a central portion of the ram, wherein the first elastomer functions as a plunger;
   a second elastomer attached to the ram, wherein the second elastomer contacts and covers the first elastomer such that an air gap is formed between the ram and second elastomer, and wherein the second elastomer has a convex outer surface; and
   wherein compressed air located between the ram and the second elastomer escapes though the evacuation path when the linear motion device is in an extended state.

2. The apparatus of claim 1, wherein the workpiece is an electronic assembly, and wherein the workpiece comprises:
   a backplate including a cavity;
   a substrate including a plurality of interconnected electrical components, wherein the substrate is positioned within the cavity; and
   an adhesive bonding the substrate to the backplate, wherein the adhesive is pressure sensitive adhesive (PSA), and wherein a wall height of the cavity is greater than a combined thickness of the adhesive and the substrate.

3. The apparatus of claim 2, wherein the substrate is a printed circuit board (PCB).

4. The apparatus of claim 2, wherein the backplate functions as a portion of a product enclosure.

5. The apparatus of claim 4, wherein the substrate is a printed circuit board (PCB).

6. The apparatus of claim 2, wherein the substrate is a ceramic substrate.

7. The apparatus of claim 2, wherein the backplate is made of a metal.

8. The apparatus of claim 7, wherein the metal is aluminum.

* * * * *